US012055916B2

(12) United States Patent
Yeh et al.

(10) Patent No.: US 12,055,916 B2
(45) Date of Patent: Aug. 6, 2024

(54) PRODUCTION LINE SCHEDULING METHOD, PRODUCTION LINE SYSTEM AND NON-TEMPORARY COMPUTER READABLE MEDIUM

(71) Applicant: INDUSTRIAL TECHNOLOGY RESEARCH INSTITUTE, Hsinchu (TW)

(72) Inventors: Yu-Jung Yeh, Zhubei (TW); Tsan-Cheng Su, Tainan (TW); Chung-Wei Lin, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 488 days.

(21) Appl. No.: 17/372,176

(22) Filed: Jul. 9, 2021

(65) Prior Publication Data

US 2022/0291658 A1    Sep. 15, 2022

(30) Foreign Application Priority Data

Mar. 10, 2021    (TW) .................................. 110108420

(51) Int. Cl.
G05B 19/4097    (2006.01)
G06F 30/20    (2020.01)

(52) U.S. Cl.
CPC ......... *G05B 19/4097* (2013.01); *G06F 30/20* (2020.01); *G05B 2219/32342* (2013.01)

(58) Field of Classification Search
CPC ........................... G05B 19/4097; G06F 30/20

(Continued)

(56) References Cited

U.S. PATENT DOCUMENTS 7,548,873 B2    6/2009 Veeningen et al.
2003/0158618 A1    8/2003 Browning
(Continued)

FOREIGN PATENT DOCUMENTS

AU    2018370534 A1    6/2020
CN    108508853 A    9/2018
(Continued)

OTHER PUBLICATIONS

Wikimedia Foundation, Wikipedia—Monte Carlo Tree Search, Jan. 2021 (4 pages) (Year: 2021).*

(Continued)

*Primary Examiner* — Mohammad Ali
*Assistant Examiner* — Joshua T Sanders
(74) *Attorney, Agent, or Firm* — Maschoff Brennan

(57) ABSTRACT

A production line scheduling method, adapted to a plurality of jobs passing a bottleneck station having at least one manufacturing machine, the jobs respectively correspond to a plurality of job conditions, and the method includes: performing a plurality of times of a schedule simulation algorithm on the jobs to sequentially establish a plurality of schedule simulation trees, and obtaining a job schedule and a simulated finishing period of each job based on the schedule simulation trees; and calculating a plurality of expected feeding times of each job at a plurality of stations including the bottleneck station, each schedule simulation tree includes at least one scheduling route, and each scheduling route is generated from one schedule simulation algorithm, the schedule simulation algorithm includes: performing a node expansion step based on at least one node expansion condition and the job conditions to obtain the scheduling route.

24 Claims, 6 Drawing Sheets

(58) Field of Classification Search
USPC .......................................................... 700/100
See application file for complete search history.

(56) References Cited

U.S. PATENT DOCUMENTS

| | | | | |
|---|---|---|---|---|
| 2006/0195209 | A1* | 8/2006 | Tseng | G05B 19/41865 700/99 |
| 2017/0153624 | A1 | 6/2017 | Cameron | |
| 2017/0255187 | A1* | 9/2017 | Troy | G05B 19/41885 |
| 2018/0036845 | A1 | 2/2018 | Thorwarth | |
| 2018/0268324 | A1 | 9/2018 | Zhang et al. | |
| 2018/0348743 | A1* | 12/2018 | Norman | G05B 19/41865 |
| 2019/0155260 | A1 | 5/2019 | Huang et al. | |
| 2020/0034798 | A1* | 1/2020 | McElroy | G06Q 10/0631 |
| 2020/0183369 | A1* | 6/2020 | Kumar | G05B 13/0265 |
| 2021/0278825 | A1* | 9/2021 | Wen | G05B 19/41865 |

FOREIGN PATENT DOCUMENTS

| | | |
|---|---|---|
| CN | 108573303 A | 9/2018 |
| CN | 110083748 A | 8/2019 |
| CN | 111918403 A | 11/2020 |
| CN | 112116189 A | 12/2020 |
| TW | 526404 B | 4/2003 |
| TW | 200630764 A | 9/2006 |
| TW | 200849114 A | 12/2008 |
| TW | 201826812 A | 7/2018 |

OTHER PUBLICATIONS

Lubosch et al., "A new MCTS-based algorithm for multiobjective flexible job shop scheduling problem" 51st CIRP Conference on Manufacturing Systems, Nov. 20, 2015.

Lu et al., "Dynamic Monte-Carlo Tree Search Algorithm for Multi-Objective Flexible Job-shop Scheduling Problem" Appl. Math. Inf. Sci. 10, No. 4, 1531-1539 (Jul. 1, 2016).

Chou et al., "Industrial scheduling with Monte Carlo tree search and machine learning" TAAI201, Nov. 20, 2015.

Matsumoto et al., "Monte-Carlo Tree Search for a reentrant scheduling problem" The 40th International Conference on Computers & Indutrial Engineering, Jul. 25, 2010.

Wu et al., "Multi-Objective Flexible Job Shop Scheduling Problem Based on Monte-Carlo Tree Search" 2013 Conference on Technologies and Applications of Artificial Intelligence, Dec. 6, 2013.

TW Office Action in Application No. 110108420 dated Dec. 1, 2021.

CN Office Action dated May 31, 2024 as received in Application No. 202110447156.4.

* cited by examiner

PRODUCTION LINE SCHEDULING METHOD, PRODUCTION LINE SYSTEM AND NON-TEMPORARY COMPUTER READABLE MEDIUM

CROSS-REFERENCE TO RELATED APPLICATIONS

This non-provisional application claims priority under 35 U.S.C. § 119(a) on Patent Application No(s). 110108420 filed in Republic of China (ROC) on Mar. 10, 2021 the entire contents of which are hereby incorporated by reference.

BACKGROUND

1. Technical Field

This disclosure relates to a production line scheduling method, production line system and non-temporary computer readable medium.

2. Related Art

In production line scheduling, due to various factors such as product material, expected delivery time and available manufacturing machine, the scheduling is made more complicated. In particular, at a production station where many of the products with different product part numbers pass, or at a production station with insufficient manufacturing machines or fixtures due to their expensive costs, and the above problems are more likely to cause difficulty in allocating resources of the station (referred to as "bottleneck station" hereinafter).

In order to make the production schedule of the bottleneck station smoother, current technologies for improving the production schedule include Gurobi linear scheduling, in combination with the Monte Carlo Tree search (MCTS) and the variable neighborhood descent algorithm to derive schedule information. However, no matter which technology is applied, the line switching times and delivery number of the derived schedule are still not ideal. Further, even the current technology comprises using MCTS to reduce the makespan of the production schedule, a more objective result can only be obtained by performing simulation on all the possible schedule arrangements. Therefore, when many jobs that need to be scheduled, a huge amount of computation and time will be required for scheduling.

SUMMARY

Accordingly, this disclosure provides a production line scheduling method, production line system and non-temporary computer readable medium.

According to one or more embodiment of this disclosure, a production line scheduling method, adapted to a plurality of jobs of an order, wherein the jobs pass a bottleneck station having at least one manufacturing machine, and the jobs respectively correspond to a plurality of job conditions, and the production line scheduling method comprises: performing a plurality of times of a schedule simulation algorithm on the jobs to sequentially establish a plurality of schedule simulation trees, and obtaining a job schedule and a simulated finishing period of each one of the jobs based on the schedule simulation trees, wherein each one of the schedule simulation trees comprises at least one scheduling route, and each scheduling route is generated from one of the times of performing the schedule simulation algorithm; and calculating a plurality of expected feeding times of each one of the jobs at a plurality of stations comprising the bottleneck station based on the simulated finishing period of each one of the jobs, wherein the schedule simulation algorithm comprises: performing a node expansion step based on at least one node expansion condition and the job conditions to obtain the scheduling route.

According to one or more embodiment of this disclosure, a production line system comprises: a computing device, configured to perform the production line scheduling method described above to obtain the job schedule; and a plurality of available manufacturing machines, communicatively connected to the computing device, with each of the available manufacturing machines obtaining a pending job among the jobs based on the job schedule after finishing a current job, and each of the available manufacturing machines further outputting a processing parameter notification based on a part number of the pending job.

According to one or more embodiment of this disclosure, a non-temporary computer readable medium comprises a program, wherein the program is performed by a computing device to perform the production line scheduling method described above.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
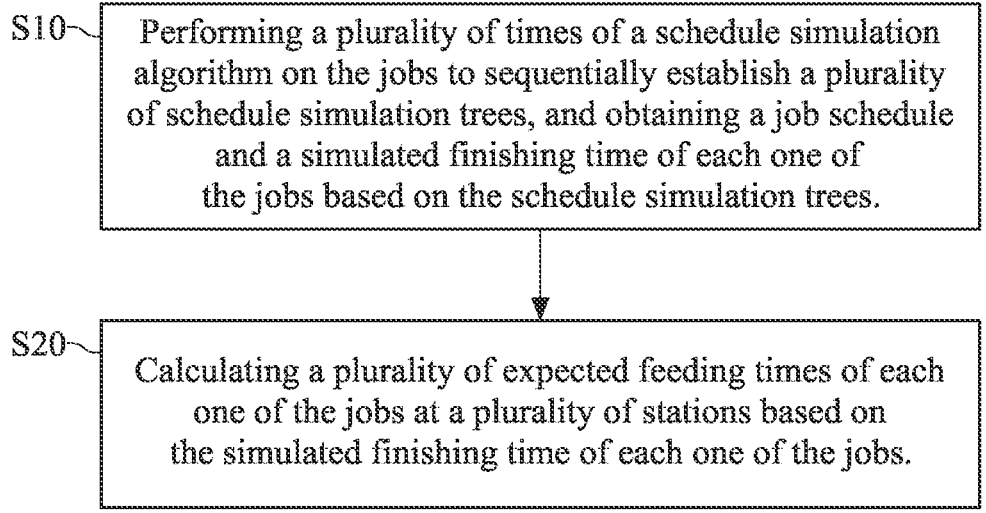
FIG. 1 illustrates a flow chart of the production line scheduling method according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown to simplify the drawings.

First, it should be noted that, the production line scheduling method may be performed by a computing device and is adapted to a plurality of jobs of an order, wherein the jobs all pass through a bottleneck station having at least one manufacturing machine, and the jobs respectively correspond to a plurality of job conditions. That is, the bottleneck station has at least one manufacturing machine to perform the processing procedure of the jobs. For example, the product of the order may be pre-processed based on the product part number, processing procedure, processing station, available machine, available fixture and standard processing time to establish resource utilization tables A and B as shown below. Before establishing the resource utilization tables, A and B, the amount of work in progress (WIP) and banks at each station are excluded, wherein the bottleneck station is one or more of the stations shown in tables A and B.

| Resource utilization table A | | | | |
|---|---|---|---|---|
| Product Part Number | Processing Procedure | Station | Available Machine | Available Fixture | Standard Processing Time (s) |
| AAA | 1 | Station 1 | Machine 1 | F1 | 70 |
| | 2 | Station 3 | Machines 3, 4 | F3 | 65 |
| | 3 | Station 5 | Machine 6 | F5 | 40 |
| | 4 | Station 7 | Machines 8, 9 | F6 | 85 |
| | 5 | Station 10 | Machine 12 | F7 | 80 |

| Resource utilization table A | | | | |
|---|---|---|---|---|
| Product Part Number | Processing Procedure | Station | Available Machine | Available Fixture | Standard Processing Time (s) |
| BBB | 1 | Station 1 | Machine 1 | F1 | 70 |
| | 2 | Station 3 | Machines 3, 4 | F3 | 65 |
| | 3 | Station 8 | Machine 10 | F5 | 40 |
| | 4 | Station 10 | Machine 12 | F4 | 85 |

As shown by the job table below, the resource utilization table A may be further turned into a job A corresponding to the part number AAA at the bottleneck station, and the resource utilization table B may be further turned into a job B corresponding to the part number BBB at the bottleneck station. Jobs A and B respectively have job conditions such as the part number, processing route, expected feeding time, etc. It should be noted that, although descriptions of above and the following are based on the job A for processing the part number AAA and job B for processing the part number BBB, the jobs A and B are not used to limit the number of jobs that may be scheduled by applying the present disclosure. That is, according to the present disclosure, the number of jobs scheduled may be two or more.

| Job table | | | | | | |
|---|---|---|---|---|---|---|
| Job | Product Part Number | Processing Route | Starting Procedure→ Final Procedure | Due Time (Hour) | Expected Feeding Time (Hour) | Piece |
| Job A | AAA | V1 | 1 → 5 | 360 | 0 | 120 |
| Job B | BBB | V2 | 1 → 4 | 480 | 0 | 120 |

Please then refer to FIG. 1, FIG. 1 illustrates a flow chart of the production line scheduling method according to an embodiment of the present disclosure.

Step S10: performing a plurality of times of a schedule simulation algorithm on the jobs to sequentially establish a plurality of schedule simulation trees, and obtaining a job schedule and a simulated finishing period of each one of the jobs based on the schedule simulation trees.

That is, each schedule simulation tree comprises at least one scheduling route, each scheduling route is generated by performing the schedule simulation algorithm once, and the job schedule and the simulated finishing period of each job are generated based on the schedule simulation trees, wherein the schedule simulation algorithm comprises performing a node expansion step based on at least one node expansion condition and the job conditions to obtain the scheduling route. Take the jobs A and B described above for example, since jobs A and B respectively have corresponding job conditions, and the job conditions comprise conditions associated with time (for example, due date/time and expected feeding time), the computing device may establish the schedule simulation trees by performing multiple times of the schedule simulation algorithm on jobs A and B based on the job conditions (for example, the part number, processing route, due date/time and expected feeding time listed in the above job table) to obtain the schedule simulation trees. The computing device may further obtain the job schedule of jobs A and B including the bottleneck station and the simulated finishing period of jobs A and B at the bottleneck station.

Step S20: calculating a plurality of expected feeding times of each one of the jobs at a plurality of stations based on the simulated finishing period of each job.

Step S20 performed by the computing device is calculating the expected feeding time of each one of the jobs at all the stations, including the bottleneck station. For example, when the simulated finishing period of job A at the bottleneck station is estimated, the computing device may determine the expected feeding time of the part number AAA at each of stations 1, 3, 5, 7 and 10 based on the simulated finishing period and the required processing time at the stations 1, 3, 5, 7 and 10, wherein the detail implementation of steps S10 and S20 will be described below.

Figure 2A:
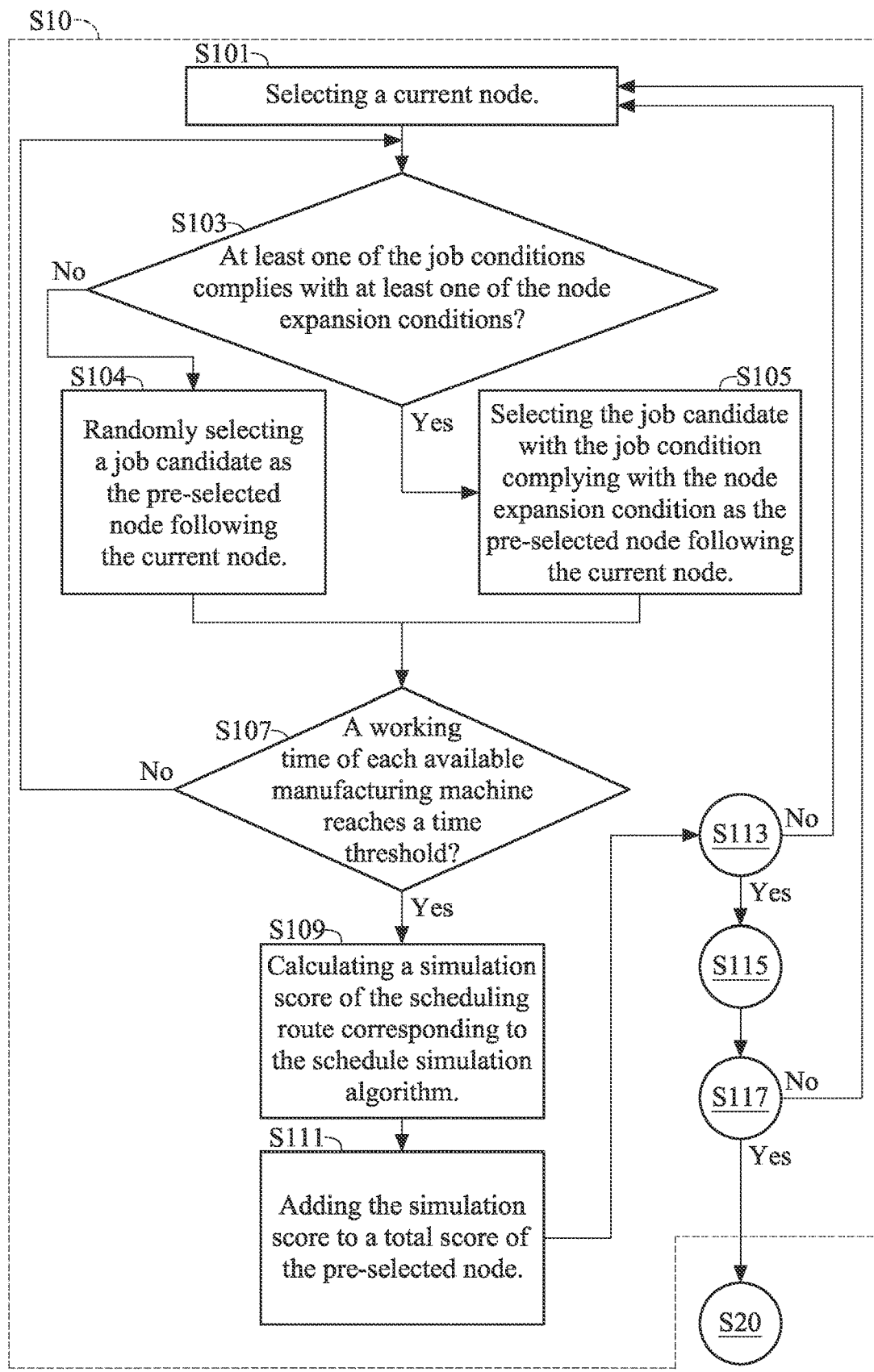
FIGS. 2A and 2B illustrate detailed flow charts of the production line scheduling method according to an embodiment of the present disclosure.
Figure 3A:
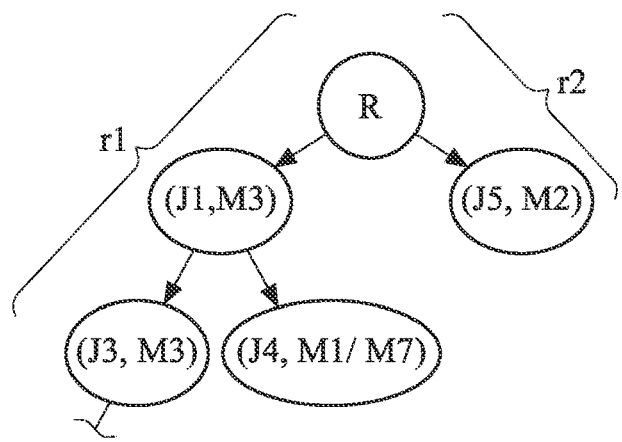
FIGS. 3A and 3B illustrate exemplary diagrams of the schedule simulation trees according to embodiments of the present disclosure.

Please refer to both FIGS. 2A and 3A, wherein FIG. 2A illustrates a detailed flow chart of the production line scheduling method according to an embodiment of the present disclosure, and the schedule simulation algorithm is implemented, for example, by the structure of Monte Carlo tree search (MCTS); and FIG. 3A illustrates an exemplary diagram of the schedule simulation tree according to embodiments of the present disclosure. Please first refer to steps S101 to S111 of the schedule simulation algorithm shown in FIG. 2A, wherein the schedule simulation algorithm is for establishing the schedule simulation tree to arrange the job nodes corresponding to the jobs into the scheduling routes of the schedule simulation tree. Each one of the job nodes corresponds to one job (such as job A or B as described above), and the job node arranged into the schedule simulation tree comprises one job and one or more available manufacturing machines for processing the job. For better understanding, a job that is not yet arranged into the schedule simulation tree will be referred to as "job candidate" herein.

In other words, each job node may be a combination of a job and one or more available machines, and the available machine may be used to process the product corresponding to the job. For example, assuming a bottleneck station has five available machines, and job candidates A and B both pass through the bottleneck station ("job candidate" refers to a job that hasn't been selected as a pre-selected node). The computing device may determine the corresponding machines based on the at least one node expansion condition and generate the job nodes of jobs A and B accordingly. Assuming the computing device, based on the at least one node expansion condition, determines that the job candidate A is preferably arranged before the job candidate B, and the job node of job A is the combination of the job A and two available machines among the five available machines, the method of generating the job node of the job candidate B performed by the computing device may be, based on the at least one node expansion condition, determining the available machines of the rest three available machines for processing job B and combining job B with the machines for processing job B to generate a job node. The present disclosure does not limit the combination of the job and machine.

Step S101: selecting a current node.

The computing device assigns one of the nodes arranged in the schedule simulation tree as a current node in step S101, and the assigned current node is the base for generating one or more pre-selected nodes connecting the current node. If the schedule simulation tree follows a selected node, and there are no other nodes in this schedule simulation tree, then the selected node is assigned as the current node, and the current node is the initial node of this schedule simulation tree. If there are no other nodes in this schedule simulation tree (not even a selected node), then a randomly selected node or a null node may be used as the initial node of this schedule simulation tree. Further, the current node selected in step S101 may be a pre-selected node in the existed scheduling route in the schedule simulation tree. The content of the current node, the pre-selected node, the selected node and the scheduling route described above will be further elaborated in the following.

For example, assuming the amount of jobs is 100, and the schedules of 5 jobs among the 100 jobs have been decided, the computing device may use the combination of the selected fifth job (the last job) and the available machine as the current node (initial node) of the schedule simulation tree, that is, the root of MCTS tree (node R as shown in FIG. 3A). Other unselected jobs (the rest 95 jobs) may be used as the job candidates. Further, if all the 100 jobs are not selected, the initial node may be a null node or a node of the combination of a job randomly selected from the 100 jobs and the available machine corresponding to the randomly selected job.

Step S101 described above is the selection step of MCTS of the present disclosure. The following steps S103 to S107 are applied to perform the node expansion step of MCTS of the present disclosure, and step S109 is applied to perform the simulation step of MCTS of the present disclosure to obtain a simulation score of each pre-selected node directly or indirectly derived from the current node in the node expansion step. Then, step S111 is applied to finish the backpropagation step of MCTS of the present disclosure, to update the simulation score of each pre-selected node connected to the current node, thereby further determine another selected node used as the next current node based on the simulation scores of the pre-selected nodes. The node expansion step is for respectively arranging the job candidates into the scheduling route, wherein the node expansion step comprises a plurality of node selection procedures, and each node selection procedure comprises steps S103 to S105 (the first node selection procedure) and step S107 (the second node selection procedure) described as follow. These steps will be further elaborated.

Step S103: determining whether at least one of the job conditions complies with at least one of the node expansion conditions.

Since each job corresponds to one or more job conditions, the computing device may select a proper job from the job candidates and the manufacturing machine corresponding to the selected job to form a node for connecting the current node based on the job conditions and the node expansion conditions. Each node expansion condition preferably comprises at least one of a part number condition, a fixture moving condition and a production starting time condition, but is not limited to the three conditions described in the present disclosure. For example, the part number condition may be a state in which the product part number of the job condition being the same as the current part number of the current node, or the part number condition may be another state in which the product part number being the as the current part number with an expected feeding time falls within a first-time threshold. The fixture moving condition may be a state in which a machine fixture of the job condition being the same as the current fixture of the current node. The production starting time condition may be a state in which the machine available time of the job condition is the earliest one among the job conditions, or the expected feeding time falls within a second time threshold which is preferably shorter than the first-time threshold described above. Further, the node expansion conditions may further include a daily production capacity condition and several times of switching production line etc., which are note limited in the present disclosure. That is, by using the node expansion conditions to select a proper job candidate as the job node, the construction of the schedule simulation tree may be more efficient.

Step S104: randomly selecting a job candidate as the pre-selected node. When the computing device determines none of the job conditions complies with the node expansion conditions, the computing device may randomly select one of the job candidates as the pre-selected node following the current node.

Step S105: selecting the job candidate with the job condition complying with the node expansion condition as the pre-selected node. When the computing device determines one of the job conditions of the job candidates complies with at least one of the node expansion conditions, the computing device uses a combination of the job candidate with the job condition complying with the node expansion condition and the corresponding available manufacturing machine, based on the current node (the node R as shown in FIG. 3A), as the pre-selected node (the pre-selected node (J1, M3) as shown in FIG. 3A, wherein J1 is the job, and M3 is the available machine at the station for processing J1) connecting the current node. Further, when multiple job conditions of the job candidates comply with one or more node expansion conditions, the computing device may use a combination of the job candidate with the earliest required feeding time and the corresponding available manufacturing machine as the pre-selected job.

After the pre-selected node is determined in steps S104 or S105, the computing device may then perform step S107: determining whether a working period of each available manufacturing machine reaches a third time threshold, or all job candidates are determined as pre-selected nodes.

Specifically, since each station corresponds to one or more manufacturing machines, the computing device may determine whether each working period of each manufacturing machine reaches the third time threshold based on the pre-selected node and at least one current node connected to the pre-selected node. For example, the third time threshold may be two days. The at least one current node connected to the pre-selected node includes the current node described above. In other words, by determining whether each working period of each manufacturing machine reaches the third time threshold, each manufacturing machine may be assigned with same or similar amount of work, a product may enter the next manufacturing machine as soon as possible after the previous manufacturing machine finishes processing of the product, and a time of switching the production line of the product part number may be reduced. The third time threshold is preferably the same as the first-time threshold, the present disclosure does not limit the third time threshold.

When not all working periods of the manufacturing machines reach the third time threshold, the computing device may define the pre-selected node as another current node, and perform another node selection procedure based on another current node. That is, take FIG. 3A as an example, the computing device defines the pre-selected node (J1, M3) as another current node, and performs another node selection procedure (that is, the computing device starts execution from step S103 again) based on another current node (J1, M3). Accordingly, another job candidate with a job condition complying with the node expansion condition and the corresponding manufacturing machine (or another job candidate selected randomly and the corresponding manufacturing machine) may be selected from the remaining unselected jobs to be used as the pre-selected node connecting another current node (as the node (J3, M3) shown in FIG. 3A). In detail, when performing step S107 for the first time, the computing device performs step S107 based on the first current node (the initial node) and the following one or more pre-selected nodes; however, when step S107 is subsequently performed by the computing device, the computing device performs step S107 based on all the current nodes (these include the initial node and all the current nodes defined by the pre-selected nodes) and the pre-selected nodes connected to the current nodes. In other words, step S107 is performed based on the pre-selected nodes and at least one current node connected to the pre-selected node to determine whether the working period of every manufacturing machine at the bottleneck station reaches the third time threshold.

When the computing device determines that the working period of every manufacturing machine reaches the third time threshold (or all the job candidates are selected as nodes) at step S107, it means the node expansion step of MCTS of the present embodiment is completed once. Therefore, the computing device may stop the node expansion step. At this time, after stopping the node expansion step, the computing device may then perform the simulation step, that is, the computing device may perform step S109: calculating a simulation score of the scheduling route including the pre-selected node and at least one current node connected to the pre-selected node.

For example, the computing device may calculate the simulation score of the scheduling route (generated from one of the times of performing the schedule simulation algorithm) including the pre-selected node and the at least one current node connecting the pre-selected node based on an allowable times of production line switching using an allowable times of production line switching equation; based on an expected production capacity using an expected production capacity equation; and based on an allowable delayed quantity using an allowable delayed quantity equation.

The allowable times of production line switching equation may be the equation (1) as shown below, wherein the score_setuptime is the simulation score; thresh_time is preferably the third time threshold described above, or thresh_time may be other time threshold for evaluating the relative relationship between a number of time of production line switching within the time threshold and the allowable times of production line switching; allowed_swi is the allowable times of production line switching; total_swi is a total times of production line switching within the time threshold.

$$\text{score\_setuptime} = \left(-\frac{0.5}{\text{thresh\_time} \times \text{allowed\_swi}}\right) \times \text{total\_swi} + 1 \quad (1)$$

The expected production capacity equation may be the equation (2) as shown below, wherein the score_qty is the simulation score; generated_qty is a product quantity generated during the time threshold; expected_qty is the expected quantity; thresh_time is preferably the third time threshold described above, or thresh_time may be other time threshold for evaluating the relative relationship between the generated quantity within the time threshold and the expected quantity.

$$\text{score\_qty} = \frac{\text{generated\_qty}}{\text{thresh\_time} \times \text{expected\_qty}} \quad (2)$$

The allowable delayed quantity equation may be the equation (3) as shown below, wherein score_delay is the simulation score; allowed_delay is the allowable delayed quantity; total_delay is a total delayed quantity within the time threshold; thresh_time is preferably the third time threshold described above, or thresh_time may be other time threshold for evaluating the relative relationship between the delayed quantity within the time threshold and the allowable delayed quantity.

$$\text{score\_delay} = \left(-\frac{0.5}{\text{thresh\_time} \times \text{allowed\_delay}}\right) \times \text{total\_delay} + 1 \quad (3)$$

Or, the way of obtaining the simulation score may be using the simulation scores score_setuptime, score_qty and score_delay as reference simulation scores, and multiplying the reference simulation scores with a respective weight, and a sum of the multiplied reference simulation scores may be the final simulation score. That is, based on manufacturing requirements, the simulation score may be any one of the scores calculated by the above three equations, or the value calculated by multiplying the three scores (calculated by the above three equations) with three weights respectively and then adding the three products together. The present disclosure does not limit the calculation of the simulation score.

After the simulation step ends, the computing device may perform the backpropagation step. That is, the computing device may perform step S111: adding the simulation score to a total score of the pre-selected node. Or, the backpropagation step may be adding the simulation score to a total score of a first pre-selected node (the first initial node (J1, M3) of the first route r1 or the first initial node (J5, M2) of the second route r2).

After the simulation score is calculated, the computing device may add the simulation score to the total score of each node on the scheduling route. That is, the computing device may add the simulation score to the respective total score of all the pre-selected nodes derived in the node expansion step. In short, a scheduling route is obtained after completing one time of the schedule simulation algorithm, and the scheduling route has a corresponding simulation score, the backpropagation step (step S111) performed by the computing device is adding the simulation score to the total scores of all the nodes on the scheduling route.

Take FIG. 3A for example, assuming the initial node selected during the selection step is node R, and the pre-selected nodes derived in the node expansion step are nodes (J1, M3) and (J3, M3), and therefore, the simulation score calculated in the simulation step is the score of the scheduling route r1 including the nodes R, (J1, M3) and (J3, M3). Then, in the backpropagation step, the computing device may add the simulation score to the pre-selected nodes (J1, M3) and (J3, M3), and this is the completion of one schedule simulation algorithm. The scheduling route r1 is one scheduling route generated during this schedule simulation algorithm.

Figure 2B:
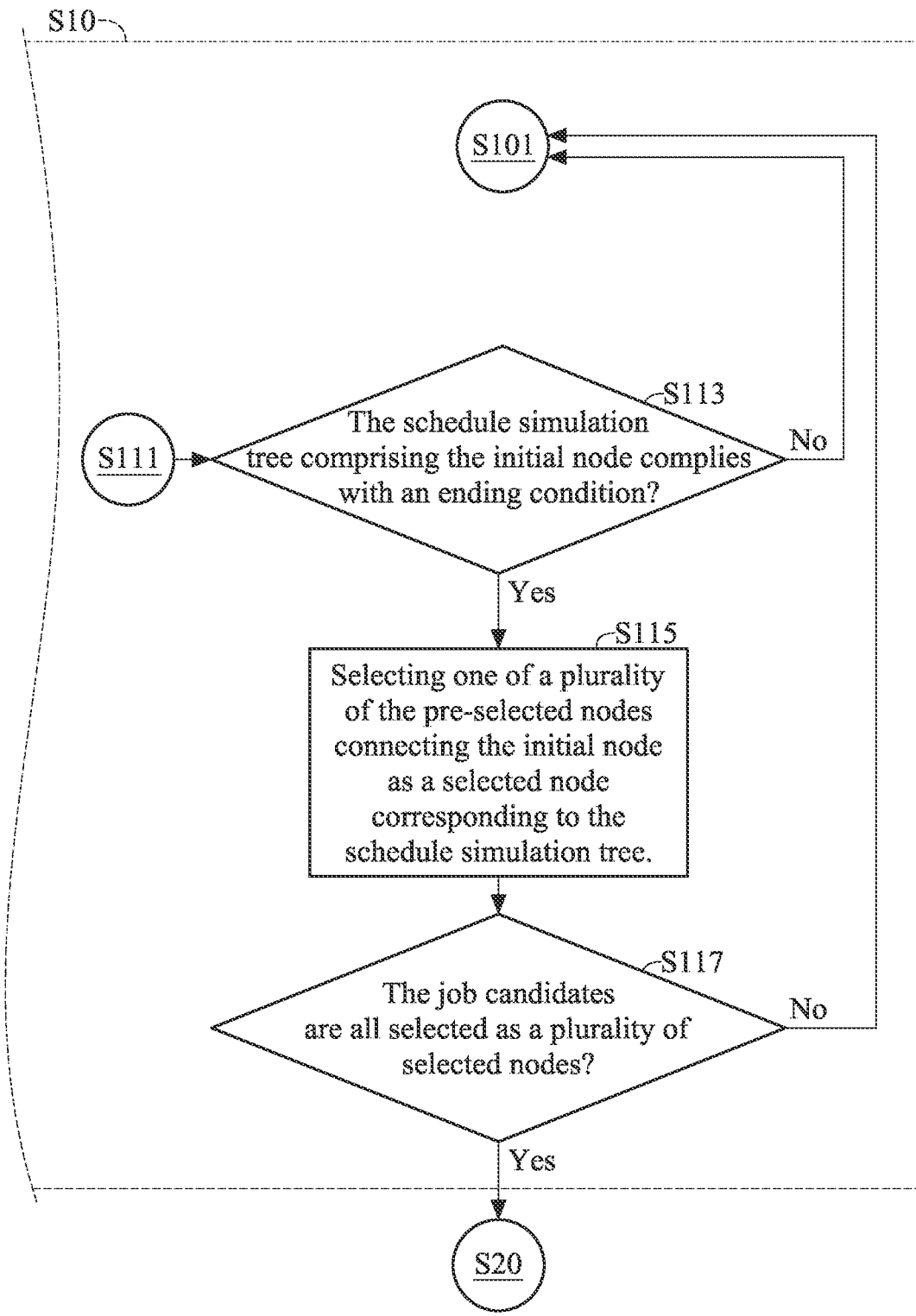

Please then refer to FIG. 2B, FIG. 2B is a detailed flow chart of the production line scheduling method according to an embodiment of the present disclosure. After performing the backpropagation step, the above-mentioned procedure of performing a plurality of times of the schedule simulation algorithm on the jobs to sequentially establish a plurality of schedule simulation trees, and obtaining a job schedule and a simulated finishing period of each one of the jobs based on the schedule simulation trees may further include steps S113, S115 and S117 described below.

Step S113: determining whether the schedule simulation tree comprising the initial node complies with an ending condition.

The computing device determines whether the schedule simulation tree established by performing a plurality of times of the schedule simulation algorithm complies with the ending condition, wherein the ending condition is, for example, the number of iteration has reached a limited number, or the total time of performing the schedule simulation algorithm has reached a limited time. The present disclosure does not limit the ending condition.

When the computing device determines the schedule simulation tree has not reached the ending condition, the computing device may perform another schedule simulation algorithm. That is, the computing device may perform step S101 again to further select a combination of another job candidate (jobs J4 or J5 as shown in FIG. 3A) connecting the current node (which can be the pre-selected node defined as the current node after step S107, or the initial node described above) and the available manufacturing machine, and define the combination as the node (node (J4, M1/M7) or node (J5, M2) as shown in FIG. 3A) connecting the current node. Take the second route r2 having node R and the connecting node (J5, M2) for example, route r2 is another scheduling route generated by performing another schedule simulation algorithm. As seen from the schedule simulation tree in FIG. 3A, the schedule simulation tree having node R as the initial node has the route r1 passing from node R and through node (J1, M3) to node (J3, M3); route r2 passing from node R and to node (J5, M2); and route r3 passing from node R and through node (J1, M3) to node (J4, M1/M7). In addition, when only one job candidate is not yet defined as the selected node and thereby the schedule simulation algorithm merely needs to be performed once, one schedule simulation tree may only include one scheduling route. The present disclosure does not limit the number of scheduling route in the schedule simulation tree.

On the other hand, when the computing device determines, in step S113, that the schedule simulation tree complies with the ending condition, the computing device may perform step S115: selecting one of a plurality of the first pre-selected nodes connecting the initial node as a selected node corresponding to the schedule simulation tree, wherein the total score of the selected node is higher than other total scores of the plurality of the first pre-selected nodes excluding the selected node.

For example, if the scheduling routes obtained after scheduling route simulation tree complying with the ending condition are the first route r1 and second route r2 as shown in FIG. 3A, the computing device may compare the total score of the pre-selected node (J1, M3) in route r1 and he total score of the pre-selected node (J5, M2) in route r2, wherein the pre-selected nodes (J1, M3) and (J5, M2) are both the first pre-selected nodes connecting the initial node R. When the computing device determines the total score of the pre-selected node (J1, M3) is higher than that of the pre-selected node (J5, M2), the computing device may define the pre-selected node (J1, M3) as the selected node.

Then, the computing device continues to step S117: determining whether the job candidates are all selected as a plurality of selected nodes. That is, the computing device determines whether the job candidates are all defined as the plurality of selected nodes respectively corresponding to the schedule simulation trees. When the computing device determines at least one of the job candidates is not yet defined as the selected node, the computing device may perform the schedule simulation algorithm again (step S101); when the computing device determines all of the job candidates are all selected as the selected nodes respectively corresponding to the schedule simulation trees, the computing device obtains the simulated finishing period of each one of the jobs based on the job schedule including the selected nodes, and accordingly performs step S20.

Figure 3B:
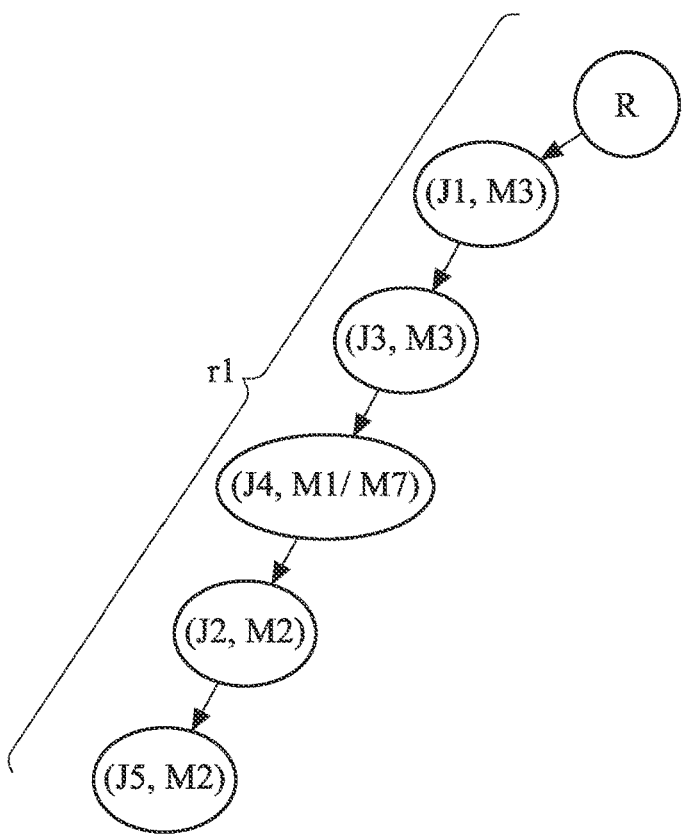

Take FIGS. 3A and 3B for example, assuming all the job candidates need to be arranged into the job schedule are jobs J1~J5, then step S117 is determining if the job candidates J1~J5 are all listed as the selected nodes. When the computing device determines, in step S117, no all the job candidates J1~J5 are listed as the selected nodes in the job schedule, the computing device may perform step S101 again. Therefore, the computing device may use the newly defined selected node as the current node, and correspondingly update the first-, second- and third-time thresholds (for example, the first time threshold is updated from the original two days to three days).

On the contrary, please refer to FIG. 3B, wherein FIG. 3B is another exemplary diagram of the schedule simulation tree according to an embodiment of the present disclosure. When the computing device determines, in step S117, that the job candidates J1~J5 are all listed as the selected nodes (meaning the jobs J1~J5 are all assigned with the corresponding available machines and are thereby listed as the selected nodes in route r1), the computing device may output the job schedule including all the job nodes (J1, M3)~(J5, M2), and calculate the simulated finishing periods of job nodes (J1, M3)~(J5, M2) at the bottleneck station. It should be noted that, node R shown in FIGS. 3A and 3B may be null node or a job node; the present disclosure does not limit the definition of node R.

In step S20 of the present embodiment, the computing device may further subtract a product (the result of multiplication) of a flow factor and a required processing time of each job from each simulated finishing period, thereby obtaining the expected feeding time of each job at the bottleneck station (expected feeding time=simulated finishing period−flow factor×required processing time). The flow factor is a value of a product delivery time of each job divided by an actual processing time; the product delivery time is a time from the product starts being processed to the product is finished; and the actual processing time is obtained by subtracting a queuing time from the product delivery time. Similarly, the same estimation may be applied to calculate the expected feeding time of each job (that passes through the bottleneck station) at other stations. The computing device may then output the expected feeding time of each job at each station of the production line. Accordingly, the job with an earliest expected feeding time, shortest production line switching time and/or earliest finishing time at a prior process may be preferentially arranged into the production line schedule. The present disclosure does not limit the arrangement priority of the jobs.

Figure 4:
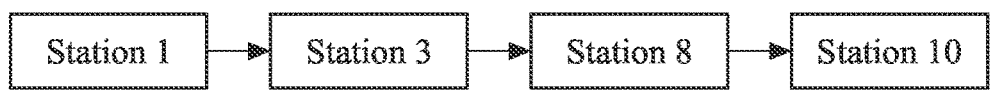
FIG. 4 illustrates an exemplary diagram of a processing procedure.

Further, in an embodiment of having a plurality of bottleneck stations, take FIG. 4 for example, it is assumed that the production process is from station 1 to station 10 as shown in FIG. 4 with stations 3 and 10 being the bottleneck stations. The computing device may first obtain the expected feeding time of each job at station 10 (the last bottleneck station) based on the required delivery time and flow factor of each job (expected feeding time=required delivery time– flow factor×required processing time). The computing device may then calculate the simulated finishing period of each job at the bottleneck station 10 by the schedule simulation algorithm, and determine the delivery time of each job at the bottleneck station 10 based on the simulated finishing period. Then, the computing device may calculate the expected feeding time of each job at station 3 by using the flow factor according to the delivery time of each job at station 10, perform the schedule simulation algorithm again to calculate the simulated finishing period of each job at station 3, and further determine the delivery time of each job at the bottleneck station 3 based on the simulated finishing period. Therefore, the computing device may obtain the expected feeding time of each job at each station by using the flow factor according to the delivery time of each job at station 3.

In another embodiment having a plurality of bottleneck stations, take stations 3 and 10 being the bottleneck stations for example, the computing device may obtain the expected feeding time of each job at stations 3 and 10 by using the flow factor based on the required delivery time of each job, and calculate the simulated finishing periods of each job at stations 3 and 10 with the approach described above. The computing device may then determine the delivery times of each job at stations 3 and 10 based on the simulated finishing periods. The computing device further obtain the expected feeding time of each job at each station based on the flow factor and the delivery times of each job at stations 3 and 10. The computing device may obtain an average of the expected feeding times based on the delivery times of each job at stations 3 and 10, and use the average as the actual feeding time of the jobs at each station.

Figure 5:
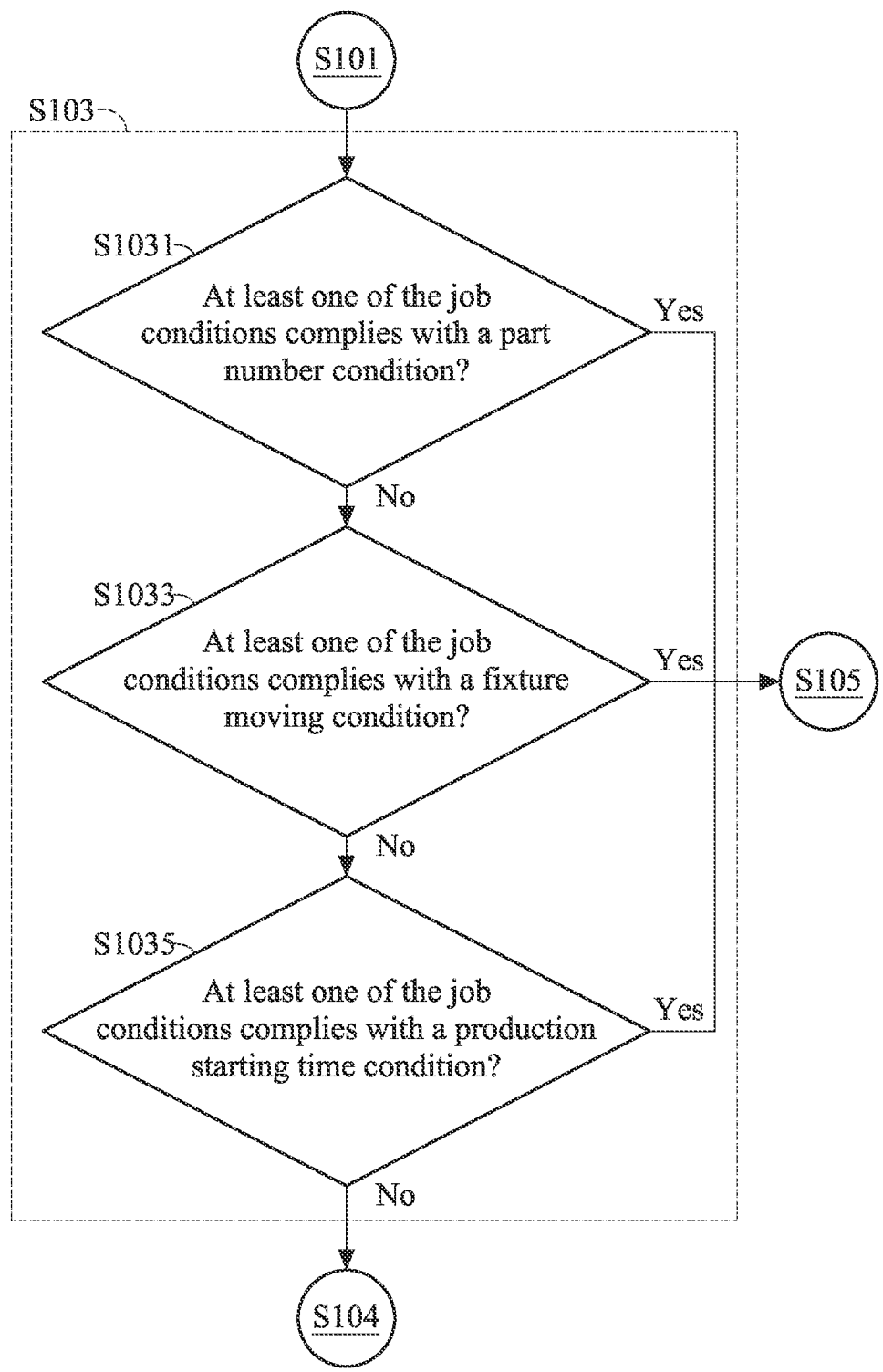
FIG. 5 illustrates a flow chart of the production line scheduling method according to another embodiment of the present disclosure.

Please refer to both FIGS. 2A and 5, wherein FIG. 5 illustrates a flow chart of the production line scheduling method according to another embodiment of the present disclosure. That is, step S103 of determining whether the job condition complies with the node expansion condition may be implemented by the sub-steps shown in FIG. 5.

Step S1031: determining whether at least one of the job conditions complies with a part number condition. When the computing device determines none of the job conditions complies with the part number condition, the computing device may perform step S1033: determining whether at least one of the job conditions complies with a fixture moving condition. When the computing device determines none of the job conditions complies with the fixture moving condition, the computing device may perform step S1035: determining whether at least one of the job conditions complies with a production starting time condition.

On the contrary, when the computing device determines at least one of the job conditions complies with the part number condition in step S1031, determines at least one of the job conditions complies with the fixture moving condition in step S1033, or determines at least one of the job conditions complies with the production starting time condition in step S1035, the computing device may perform step S105 shown in FIG. 2A.

It should be noted that, the part number condition in step S1031 may further comprise a state in which a sum of a working period of one or more pre-selected nodes obtained in the node expansion step and a working period of the current node connected to the one or more pre-selected nodes is less than a continuous working period, wherein the continuous working period is, for example, two days. That is, since the current node and the pre-selected node usually have the same part number and thereby correspond to the same machine (such as the nodes (J1, M3) and (J3, M3) shown in FIG. 3A), the working period of each machine may be more even by implementing the mechanism of the continuous working period.

In the above description, the sequence of steps S1031, S1033 and S1035 shown in FIG. 4 is merely an example, the sequence of the node expansion conditions may be adjusted based on production needs, or, the node expansion conditions may be added or omitted, the present disclosure is not limited thereto.

Figure 6:
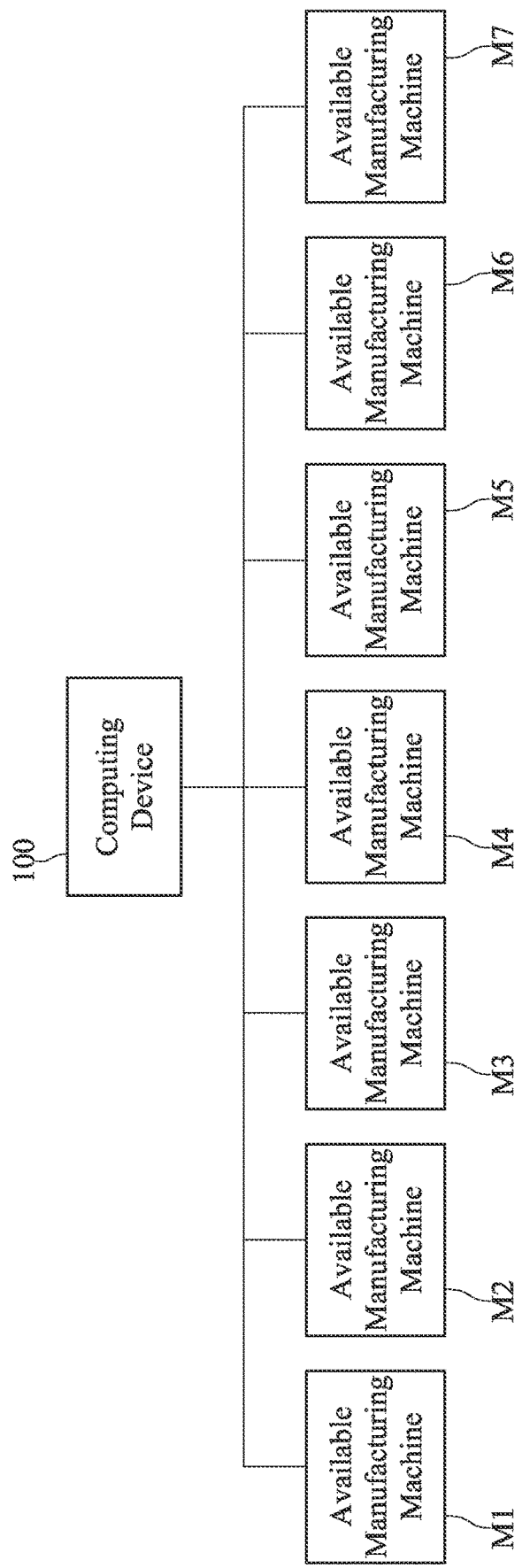
FIG. 6 illustrates a block diagram of the production line system according to an embodiment of the present disclosure.

Please refer to FIG. 6, FIG. 6 illustrates a block diagram of the production line system according to an embodiment of the present disclosure. The production line scheduling method and the schedule simulation algorithm thereof described above are preferably performed by the computing device 100 of the production line system, and is adapted to the production line system comprising the computing device 100 and a plurality of available manufacturing machines M1~M7. The computing device 100 may be a central processing unit or other device having computing functions, the present disclosure does not limit the type of the computing device 100. The available manufacturing machines M1~M7 are communicatively connected to the computing device 100. Specifically, the computing device 100 is configured to perform the production line scheduling method described above to obtain the expected feeding time of each job at the bottleneck station. Therefore, each one of the available manufacturing machines M1~M7 may obtain a pending job from the remaining jobs after finishing a current job. Take FIG. 3B for example, when machine M3 finishes job J1, machine M3 may determine the next pending job among the remaining jobs J2~J5 is job J3 based on the job schedule. Therefore, machine M3 may adjust a processing parameter according to the pending job J3.

That is, after obtaining the pending job, each one of the available manufacturing machines M1~M7 may further output a processing parameter notification based on the part number of each pending job. The available manufacturing machines M1~M7 may then process the pending job after the processing parameter of the machine for processing the pending job is adjusted. In detail, after obtaining the pending job, each available manufacturing machine may determine whether the part number of the pending job is the same as another part number of the current job or a finished prior job. The available manufacturing machine may output a parameter inheriting notification when the part number is the same as another part number of the current job; on the contrary, the available manufacturing machine may output a parameter switching notification when the part number is different from another part number of the current job. Accordingly, when the product part number differs, the available manufacturing machine may load a corresponding processing parameter, or notify the factory personnel to adjust the processing parameter.

In addition, the present disclosure provides a non-temporary computer readable medium comprising a program, the computing device may execute the program to perform the production line scheduling method and its schedule simulation algorithm described above. The non-temporary computer readable medium may be magnetic storage media, optical magnetic storage media (e.g. magneto-optical disks), CD-ROM (read only memory), CD-R, CD-R/W, and semiconductor memories. The present disclosure does not limit the types of the non-temporary computer readable medium.

In view of the above description, according to the production line scheduling method, production line system and non-temporary computer readable medium of the present disclosure, the node expansion step of MCTS may be performed more efficiently, and the simulation score of MCTS may be calculated in advance without generating every possible simulation tree, thereby reducing the amount of time spent on obtaining the schedule solution of each job at the same time allowing the production schedule of the bottleneck station to be smoother. In addition, according to the production line scheduling method, production line system and non-temporary computer readable medium of the present disclosure, the expected feeding time of each job at each station may be obtained based on the finishing time of each job at the bottleneck station, and the expected feeding time of each job may be used as the basis for the entire production line scheduling.

What is claimed is:

1. A production line scheduling method, adapted to a plurality of jobs of an order, wherein the jobs pass a bottleneck station having at least one manufacturing machine, and the jobs respectively correspond to a plurality of job conditions, and the production line scheduling method comprising:
    performing a plurality of times of a schedule simulation algorithm on the jobs to sequentially establish a plurality of schedule simulation trees, and obtaining a job schedule and a simulated finishing period of each one of the jobs based on the schedule simulation trees, wherein each one of the schedule simulation trees comprises at least one scheduling route, and each scheduling route is generated from one of the times of performing the schedule simulation algorithm;
    transmitting the job schedule to a plurality of available manufacturing machines; and
    calculating a plurality of expected feeding times of each one of the jobs at a plurality of stations comprising the bottleneck station based on the simulated finishing period of each one of the jobs,
    wherein the schedule simulation algorithm comprises:
        performing a node expansion step based on at least one node expansion condition and the job conditions to obtain the scheduling route;
    wherein the at least one manufacturing machine obtains a pending job based on the transmitted job schedule and adjusts a processing parameter according to the obtained pending job.

2. The production line scheduling method according to claim 1, wherein the at least one node expansion condition comprises at least one of a part number condition, a fixture moving condition and a production starting time condition.

3. The production line scheduling method according to claim 2, wherein the part number condition comprises: a state in which a product part number of the job condition is the same as a current part number of a current node.

4. The production line scheduling method according to claim 3, wherein the part number condition further comprises: another state in which an expected feeding time of the job condition falls within a time threshold.

5. The production line scheduling method according to claim 2, wherein the fixture moving condition comprises: a state in which a machine fixture of the job condition is the same as a current machine fixture of a current node.

6. The production line scheduling method according to claim 2, wherein the production starting time condition comprises: a state in which a machine available time of the job condition is the earliest one among the job conditions.

7. The production line scheduling method according to claim 1, wherein the at least one node expansion condition is a plurality of node expansion conditions, the node expansion step of the schedule simulation algorithm is for arranging the jobs into the scheduling route, wherein the node expansion step comprises a plurality of node selection procedures, and each one of the node selection procedures comprises a sub-node selection procedure, wherein the sub-node selection procedure comprises:
    determining whether at least one of the job conditions complies with at least one of the node expansion conditions;
    when determining at least one of the job conditions complies with at least one of the node expansion conditions, selecting one of the jobs and a corresponding one of the plurality of available manufacturing machines with the at least one of the job conditions complying with the at least one of the node expansion conditions, based on a current node, as a pre-selected node following the current node; and
    when determining none of the job conditions complies with the node expansion conditions, randomly selecting one of the jobs and a another corresponding one of the plurality of available manufacturing machines as the pre-selected node following the current node.

8. The production line scheduling method according to claim 7, wherein the sub-node selection procedure is a first sub-node selection procedure, each one of the node selection procedures further comprises a second sub-node selection procedure, and the second sub-node selection procedure is performed after the first sub-node selection procedure, wherein the second sub-node selection procedure comprises:
    determining whether at least one working period respectively corresponding to the at least one manufacturing machine all complies with a time threshold based on the pre-selected node and at least one current node connecting the pre-selected node, wherein the at least one current node connecting the pre-selected node comprises said current node;
    defining the pre-selected node as another current node and performing another one of the node selection procedures based on the another current node when the working period of one of the at least one manufacturing machine does not reach the time threshold; and
    stopping the node selection procedures when the at least one working period all complies with the time threshold.

9. The production line scheduling method according to claim 8, wherein the schedule simulation algorithm further comprises a simulation step performed after stopping the node expansion step, and the simulation step comprises: calculating a simulation score of the scheduling route corresponding to the schedule simulation algorithm.

10. The production line scheduling method according to claim 9, wherein in a first one of the node selection procedures, the current node is an initial node, the pre-selected node is a first pre-selected node, and the schedule simulation algorithm further comprises a backpropagation step performed after the simulation step, and the backpropagation step comprising:
adding the simulation score to a total score of the first pre-selected node.

11. The production line scheduling method according to claim 10, wherein performing the plurality of times of the schedule simulation algorithm on the jobs to sequentially establish the plurality of schedule simulation trees comprises:
determining whether one of the schedule simulation trees comprising the initial node complies with an ending condition;
performing another one of the times of the schedule simulation algorithm when the schedule simulation tree is determined as not reaching the ending condition; and
selecting one of a plurality of the first pre-selected nodes connecting the initial node as a selected node corresponding to the schedule simulation tree when the schedule simulation tree complies with the ending condition, wherein a total score of the selected node is higher than other total scores of the plurality of the first pre-selected nodes excluding the selected node.

12. The production line scheduling method according to claim 9, wherein calculating the simulation score of the scheduling route corresponding to the schedule simulation algorithm comprises:
calculating the simulation score based on an allowable times of production line switching, an expected production capacity and an allowable delayed quantity.

13. The production line scheduling method according to claim 12, wherein calculating the simulation score based on the allowable times of production line switching is: calculating the simulation score based on the time threshold, the allowable times of production line switching within the time threshold and a total times of production line switching within the time threshold.

14. The production line scheduling method according to claim 12, wherein calculating the simulation score based on the expected production capacity is: calculating the simulation score based on the time threshold, a produced number within the time threshold and the expected production capacity within the time threshold.

15. The production line scheduling method according to claim 12, wherein calculating the simulation score based on the allowable delayed quantity is: calculating the simulation score based on the time threshold, the allowable delayed quantity within the time threshold and a total delayed number within the time threshold.

16. The production line scheduling method according to claim 12, wherein calculating the simulation score based on the allowable times of production line switching, the expected production capacity and the allowable delayed quantity is:
calculating reference simulation scores respectively corresponding to the allowable times of production line switching, the expected production capacity and the allowable delayed quantity;
multiplying each of the reference simulation scores of the allowable times of production line switching, the expected production capacity and the allowable delayed quantity with a respective one of a weight; and
using a sum of the reference simulation scores respectively multiplied with the weights as the simulation score.

17. The production line scheduling method according to claim 8, wherein determining whether at least one of the job conditions complies with at least one of the node expansion conditions comprises:
determining whether at least one of the job conditions complies with a part number condition;
determining whether at least one of the job conditions complies with a fixture moving condition when none of the job conditions complies with the part number condition;
determining whether at least one of the job conditions complies with a production starting time condition when none of the job conditions complies with the fixture moving condition; and
randomly selecting another one of the jobs as the pre-selected node when none of the job conditions complies with the production starting time.

18. The production line scheduling method according to claim 8, wherein when more than one of the job conditions comply with the node expansion condition, the production line scheduling method further comprises:
using the job corresponding to the job condition with an earliest required feeding time among the job conditions as the pre-selected node.

19. The production line scheduling method according to claim 8, wherein the node expanding conditions comprise a part number condition, the part number condition comprises: a state in which a sum of a working period of the pre-selected node obtained in the node expansion step and a working period of the at least one current node connected to the pre-selected node is less than a continuous working period, and determining whether at least one of the job conditions complies with at least one of the node expansion conditions comprises:
determining, based on the job conditions, whether the sum of the working period of the pre-selected node obtained in the node expansion step and the working period of the at least one current node connected to the pre-selected node is less than the continuous working period; and
determining whether at least one of the job conditions complies with another one of the job conditions when the sum of the working periods is not less than the continuous working period.

20. The production line scheduling method according to claim 1, wherein performing the plurality of times of the schedule simulation algorithm on the jobs to sequentially establish the plurality of schedule simulation trees, and obtaining the job schedule and the simulated finishing period of each one of the jobs based on the schedule simulation trees comprises:
determining whether the jobs are all selected as a plurality of selected nodes respectively corresponding to the schedule simulation trees;
performing another time of the schedule simulation algorithm when at least one of the jobs hasn't been selected as one of the selected nodes; and
obtaining the simulated finishing period of each one of the jobs using the job schedule comprising the selected nodes when the jobs are all selected as the plurality of selected nodes.

21. The production line scheduling method according to claim 1, wherein calculating one of the expected feeding times comprises:

dividing a product delivery time of one of the jobs by an actual processing time to obtain a flow factor; and subtracting a product of a required processing time and the flow factor from the simulated finishing period of the one of the jobs to obtain the expected feeding time.

22. A production line system, comprising:
a computing device, configured to perform the production line scheduling method of claim 1 to obtain the job schedule and transmit the job schedule to the plurality of available manufacturing machines; and
the plurality of available manufacturing machines, communicatively connected to the computing device, with each of the available manufacturing machines obtaining a pending job among the jobs based on the job schedule after finishing a current job, and each of the available manufacturing machines further outputting a processing parameter notification based on a part number of the pending job.

23. The production line system according to claim 22, wherein
each of the available manufacturing machines outputs the processing parameter notification comprising a parameter switching notification when determining the part number is different from another part number of the current job, and
each of the available manufacturing machines outputs the processing parameter notification comprising a parameter inheriting notification when determining the part number is the same as the another part number of the current job.

24. A non-transitory computer readable medium, comprising a program, wherein the program is performed by a computing device to perform the production line scheduling method of claim 1.

* * * * *